United States Patent [19]
Roney et al.

[11] Patent Number: 5,632,551
[45] Date of Patent: May 27, 1997

[54] LED VEHICLE LAMP ASSEMBLY

[75] Inventors: Troy L. Roney, Madison; Bruce S. Rigsby, Charlestown, both of Ind.

[73] Assignee: Grote Industries, Inc., Madison, Ind.

[21] Appl. No.: 665,388

[22] Filed: Jun. 18, 1996

Related U.S. Application Data

[63] Continuation-in-part of Ser. No. 276,199, Jul. 18, 1994, Pat. No. 5,528,474.

[51] Int. Cl.⁶ .................................................. F21V 29/00
[52] U.S. Cl. .................. 362/249; 362/294; 362/373; 362/800; 362/61; 362/267; 264/272.13
[58] Field of Search ....................... 362/249, 800, 362/240, 235, 252, 61, 310, 294, 373, 80.1, 80, 83.3, 267; 264/1.7, 272.16, 272.13, 272.11

[56] References Cited

U.S. PATENT DOCUMENTS

| | | |
|---|---|---|
| 4,271,408 | 6/1981 | Teshima et al. . |
| 4,293,847 | 10/1981 | McCarty ........................... 362/267 |
| 4,632,798 | 12/1986 | Eickman et al. . |
| 4,654,629 | 3/1987 | Bezos et al. . |
| 4,729,076 | 3/1988 | Masami et al. . |
| 4,733,335 | 3/1988 | Serizawa et al. . |
| 4,774,434 | 9/1988 | Bennion . |
| 4,826,896 | 5/1989 | Procter . |
| 4,851,972 | 7/1989 | Altman ............................ 362/267 |
| 4,929,866 | 5/1990 | Murata et al. . |
| 4,935,665 | 6/1990 | Murata . |
| 4,951,179 | 8/1990 | Machida . |
| 5,038,255 | 8/1991 | Nishihashi et al. . |
| 5,062,027 | 10/1991 | Machida et al. . |
| 5,162,696 | 11/1992 | Goodrich . |
| 5,241,457 | 8/1993 | Sasajima et al. . |
| 5,268,828 | 12/1993 | Miura . |
| 5,278,432 | 1/1994 | Ignatius et al. . |
| 5,278,731 | 1/1994 | Davenport et al. . |
| 5,313,729 | 5/1994 | Sakai et al. . |
| 5,345,705 | 9/1994 | Lawrence . |

*Primary Examiner*—Ira S. Lazarus
*Assistant Examiner*—Thomas M. Sember
*Attorney, Agent, or Firm*—Woodard, Emhardt, Naughton Moriarty & McNett

[57] ABSTRACT

A lamp, such as for truck trailers and/or tractors, is provided with LEDs mounted to a circuit board placed in a housing. The housing is thereafter partially filled with a liquid resin material and a lip portion of a lens member is pressed into the resin into contact with the circuit board. The resin material is cured with thermally conductive particles suspended therein for conducting excess heat to the outer aluminum housing and the outer environment. A hermetic seal is formed by the resin material between the lens member and the LED bearing circuit board. The lens member has a series of parallel, elongated lens ribs providing constant optics while allowing additional LEDs to be positioned in a row behind a lens rib. The lens member is completely recessed within the housing for enhanced protection from mechanical damage thereto.

22 Claims, 8 Drawing Sheets

LED VEHICLE LAMP ASSEMBLY

This application is a continuation-in-part of Ser. No. 08/276,199 filed Jul. 18, 1994 U.S. Pat. No. 5,528,474, issued on Jun. 18, 1996 to the same inventive entity, and entitled LED ARRAY VEHICLE LAMP.

FIELD OF THE INVENTION

The present invention relates generally to lamps, and more specifically to vehicle lamps having an array of light emitting diodes (LEDs) requiring heat dissipation.

BACKGROUND OF THE INVENTION

Certain light sources, including LEDs, are useful in lamps, such as for passenger cars, high mount stop lamps, clearance/marker lamps, as well as heavy duty tractor and trailer lamps. Lamps may be used as combination brake, turn and tail lamps for heavy duty trucks and trailers. Ordinarily, however, for LED lamps this requires the use of multiple LEDs in order to satisfy the Federal Motor Vehicle Safety Standard (FMVSS) 108 lighting requirements. Moreover, such lamps must illuminate seventy-five (75) square centimeters of lens area to provide proper visibility. When LEDs are tightly spaced in an array, the junction temperature of the LEDs can significantly reduce the light output below legal requirements when the lamp is energized for an extended period of time.

While other lamps have attempted to use heat sinks to address this problem, the present invention provides excellent heat conductivity solutions to this problem while also providing other advantages.

SUMMARY OF THE INVENTION

In accordance with one aspect of the present invention, a lamp assembly comprises a housing defining an inner surface and a light transmissive window on the housing. At least one light emitting unit is mounted to a carrier that is positioned within the housing. The carrier and the light transmissive window define a space therebetween and the light emitting unit emits light toward the light transmissive window. A formable medium is further located within the housing with the carrier and the light transmissive window at least partially embedded therein. The medium is operable to bond to the carrier, the light transmissive window and the inner surface of the housing such that the space between the carrier and the light transmissive window is hermetic.

In accordance with another aspect of the present invention, a lamp assembly comprises a housing and a light emitting diode (LED) mounted to a circuit board that is positioned within the housing. A first formable medium is further located within the housing with the circuit board at least partially embedded therein. A light transmissive window is recessed within the housing and positioned in front of the LED in contact with the first formable medium. The first formable medium is operable to bond to the housing, the circuit board and the light transmissive window.

In accordance with yet another aspect of the present invention, a method of forming a lamp assembly comprises the steps of providing a housing, positioning a circuit board having a plurality of light emitting diodes (LEDs) mounted thereto in the housing, filling at least a portion of the housing with an initially fluid material in contact with the circuit board, positioning a light transmissive window in front of the LEDs and in contact with the initially fluid material; and solidifying the initially fluid material into a solid material bonded to the housing, the circuit board and the light transmissive window.

One object of the present invention is to provide an improved lamp. Another object is to provide a hermetically sealed lamp that may be easily constructed. These and other objects are apparent from the background and the following disclosure.

DESCRIPTION OF THE PREFERRED EMBODIMENT

Figure 1:
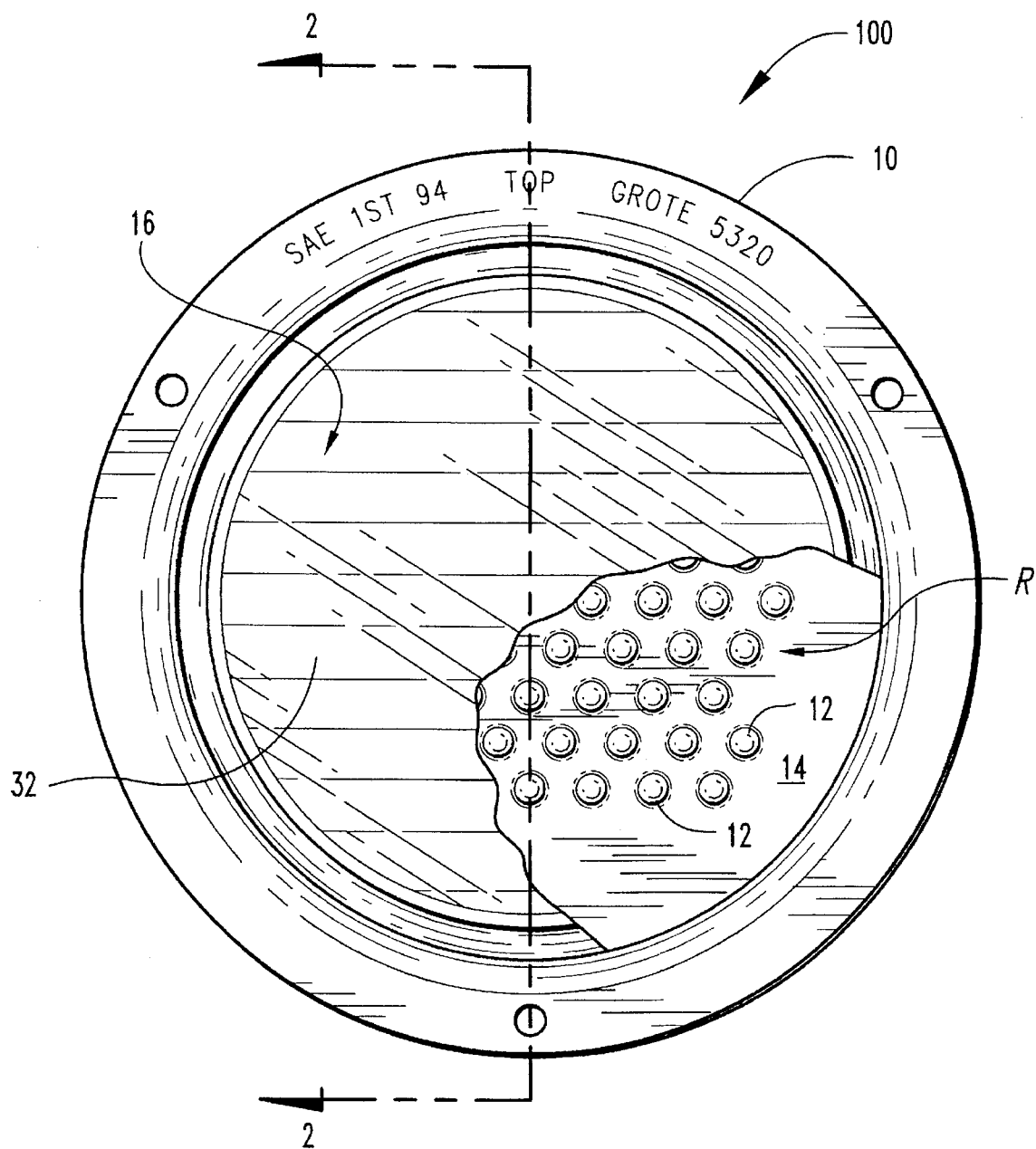
FIG. 1 is a front view of the lamp assembly of one version of the present invention showing the lens partially cut away to expose interior portions of the lamp.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Figure 2:
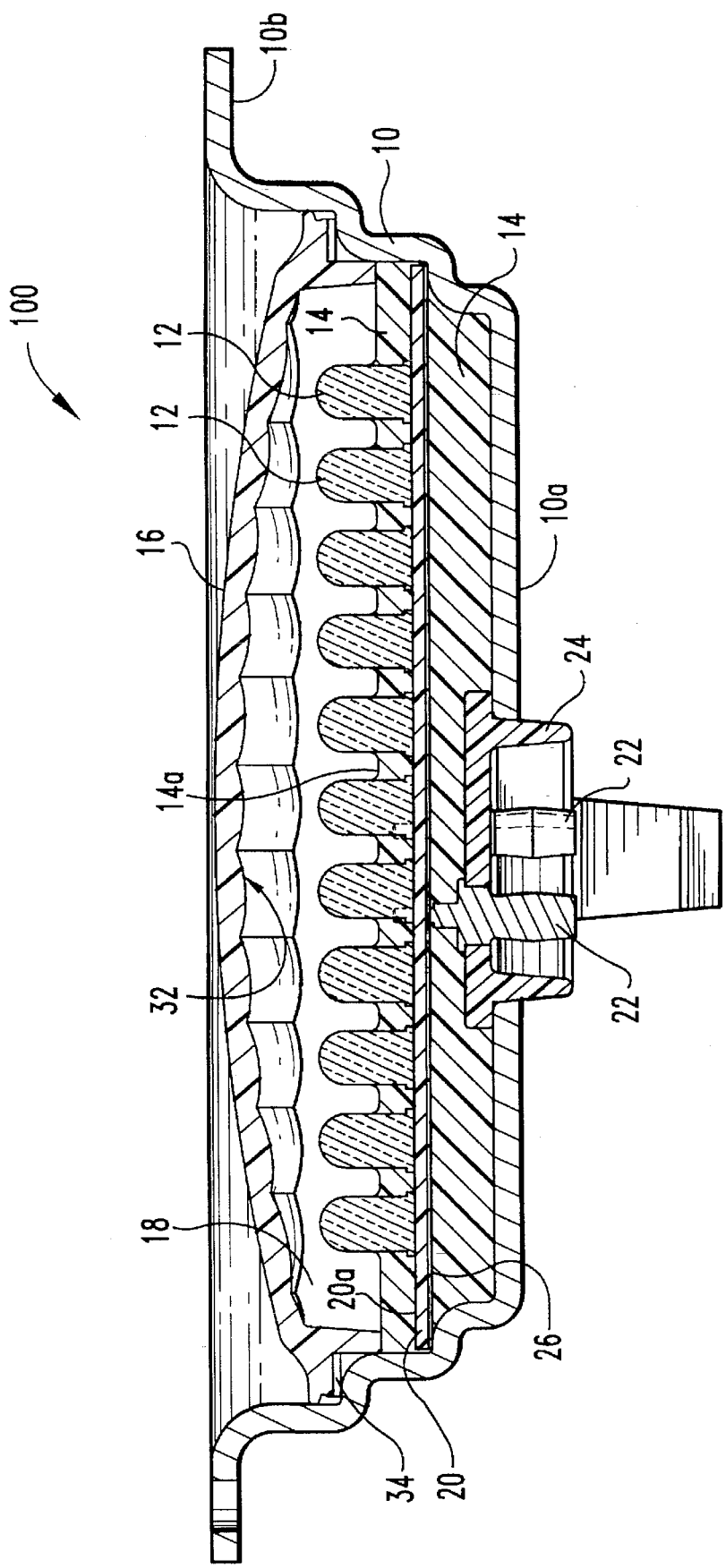
FIG. 2 is a side cross-sectional view taken along section line 2—2 of FIG. 1.

Referring to FIGS. 1 and 2, lamp assembly 100 includes housing 10 and light transmissive window or lens 16 which define a three dimensional space 18 therebetween. Housing 10 including flange portion 10b provides a recessed well to provide protection of the lens against breakage and to provide a sturdy and convenient mechanical mechanism to mount the lamp into a vehicle such as a tractor and/or a truck trailer. Within the space and secured to the housing is a circuit board 20 having light emitting units, preferably light emitting diodes (LEDs), 12 mounted on circuit board 20. Electrical power for the lamp is provided to the LEDs and circuit boards via electrical terminals or prongs 22. In one preferred embodiment, the electrical terminals 22 are three male protrusions arranged in a triangular configuration with respect to each other (see FIG. 3) within a circular recess of snap-in fitting 24. The snap-in fitting 24 is preferably made of plastic or other electrically insulating material and is snap fitted into housing 10. Terminals 22 are preferably soldered or otherwise connected to circuit board 20 providing a singular subassembly shown in FIG. 3 located in the space of the lamp. Upon snap fitting of this assembly into the housing, a liquid resin or other matrix is poured, injected, or otherwise placed into the housing to form a thermally conductive medium 14. Preferably, this medium is made of a formable matrix material, such as an epoxy resin, having a first coefficient of thermal conductivity (e.g., 1 to 1.5 BTU-IN/hr-ff$^2$-°F.) and is further made of a suspended material comprising heat conductive particles suspended in the matrix material. The particles have a second coefficient of thermal conductivity (e.g., about 80 BTU-IN/hr-ff$^2$-°F.) which is higher than the first coefficient of thermal conductivity, wherein the thermally conductive medium 14 conducts heat emitted from the light emitting units 12 out of lamp assembly 100. Preferably, the thermally conductive particles are metallic, ordinarily being made of alumina, aluminum or other particles suspended in the epoxy matrix. Such thermally conductive material 14 is commercially available as RESTECH 9695 offered by Restech Company of Commerce City, Colo., U.S.A. The overall thermal conductivity of medium 14 preferably, although not necessarily, is not less than about 8BTU-IN/hr-ff$^2$-°F. while maintaining an electrical resistivity of typically at least 5.6×10$^{15}$ OHM-CM. Notably, thermally conductive medium 14 is preferably interstitially located between and in contact with most or all of the LEDs such as shown at 14a. This not only provides a greater heat sink and ability to withdraw thermal energy directly from the LEDs, but also provides a rigid and in situ custom formed buffer protecting the LEDs and the circuit board from vibration, fatigue, moisture and the like.

Figure 3:
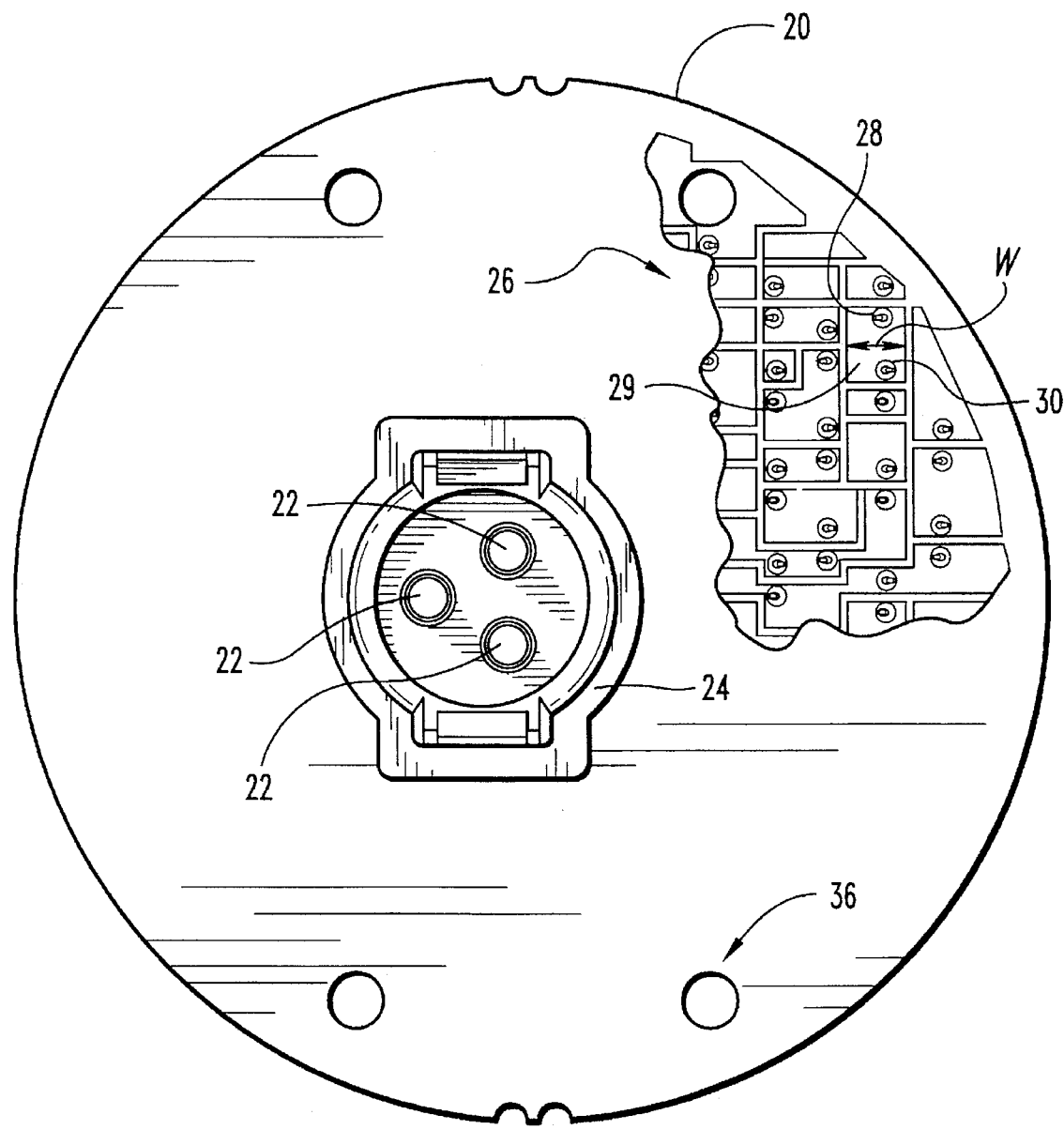
FIG. 3 is a rear view of the circuit board assembly used in the lamp of FIGS. 1 and 2 partially showing in the upper right hand corner the large copper traces which conduct heat from the cathode and anode of the LEDs.

Circuit board 20 is formed with a copper circuit pattern formed as layer 26 shown directly clad to the backside of circuit board 20. Circuit board 20 preferably is made of 1/16" NEMA grade FR-4 material with 2 oz. copper thickness (double sided) and is commercially available from W. L. Gore & Associates, Inc., of Phoenix, Ariz., U.S.A. A representative portion of the backside of circuit board 20 is shown in the upper right hand portion of FIG. 3 illustrating copper layer 26 comprising large copper traces, such as copper trace 29. It is to be understood that the circuit board of FIG. 3 has copper traces over substantially the entire back face, preferably covering at least 85 percent of the back face of circuit board 20 and more preferably covering at least 90 percent of such surface area. The large copper traces, such as trace 29, have large widths such as width W (see FIG. 3) running between LEDs in a series. By having such large copper traces, the copper traces help act as a heat sink which conduct heat from the cathode 28 and the anode 30 of respective LEDs to provide a dedicated heat sink having a large surface area facing and in contact with thermally conductive medium 14 located between copper layer 26 and housing 10. In one preferred embodiment, housing 10 is made of metal, preferably aluminum, having good heat conductivity characteristics. As such, heat from the cathodes and anodes is transferred to the copper layer 26 in the form of copper traces directly into the thermally conductive medium 14. A fair amount of heat will also be generated by the body of the LEDs which, due to the "top" layer of medium 14 will also be transferred to the housing. Heat is transferred through the medium by conduction through the aluminum or other particulate matter. Since medium 14 is bonded directly to aluminum housing 10, preferably without any intermediate adhesives providing additional thermal boundaries, heat is conducted through housing 10 and shed to the outside environment. As such, the temperature of the LEDs and space 18 may be kept sufficiently cool to prevent degradation of the brightness of the lamp to meet the legal criteria set forth (e.g., FMVSS108) and incorporated herein and/or other criteria which may be established in terms of luminescence.

As shown in FIG. 1, the LEDs 12 are preferably arranged in a two-dimensional array having rows and columns, such as row R. Similarly, lens 16 is formed with a series of parallel lens ribs, such as lens rib 32 running parallel to row R and above the LEDs in row R. The lens ribs are shown in cross-sectional view FIG. 2, and cross-sectionally lens rib 32 is preferably convex formed in the arc of a circle so that along its longitudinal direction it forms a generally partial cylindrical shape. Since lens 16 is formed in a dome configuration, the cylindrical shape of the lens rib has a domed bow shape. As illustrated in the drawing figures, each of the rows of LEDs has a corresponding lens rib running parallel to it and over it with space 18 there in between. This lens rib configuration, as opposed to discrete lens for each LED, provide design flexibility and manufacturing savings for this type of light. Specifically, a particular light with a greater luminescence requirement may be made with a correspondingly higher density of LEDs spaced more closely together. In such redesign configuration, additional LEDs may be located in a given row without having to change the lens configuration of lens 16 since its lens rib feature will provide substantially constant optical characteristics along a given lens rib row. In one preferred embodiment, lens 16 is formed of a red tinted singularly molded piece of plastic with the lens ribs formed therein. It is to be understood that other lens rib configurations including separate lens rib elements, singular lens rib elements, non-spherical and/or non-convex arrangements may be used according to design requirements. Other tints or clear may be used for the lens which is light transmissive. Moreover, the lens ribs may, instead of being parallel and linear as shown, be arranged in parallel arcs and/or parallel annular (circular) tiers.

Housing 10 preferably is formed from a single piece of aluminum. As illustrated in FIG. 2, it forms a general cup shape for receiving the resin therein. The cup configuration has a bottom portion 10a and a parallel outer flange portion 10b with a series of annular stepped portion as illustrated for supporting circuit board 20 and lens 16. Preferably, a silicone or other seal 34 is provided between the lens and the housing with space 18 being substantially watertight.

Figure 4:
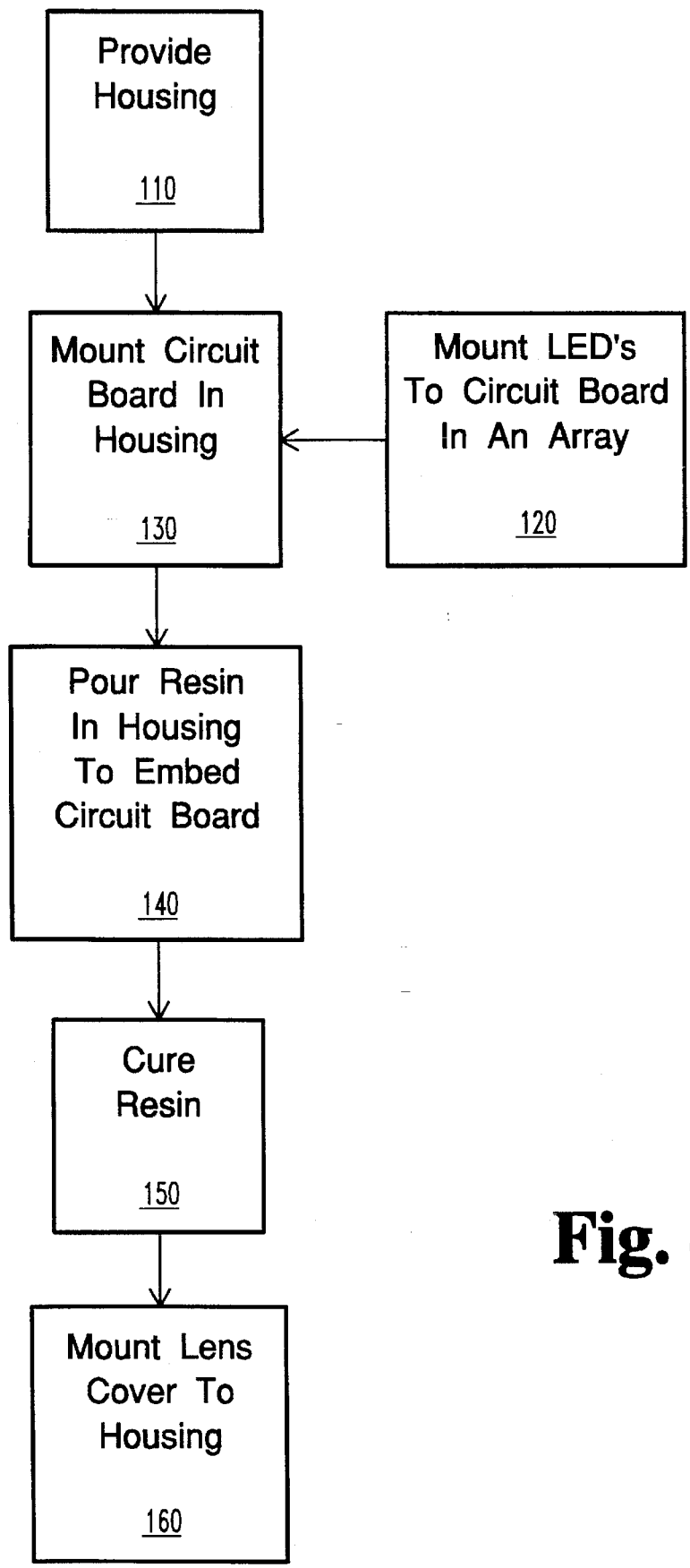
FIG. 4 is a flow chart illustrating one method of manufacturing the lamp assembly of FIGS. 1–3.

One method of making lamp assembly 100 is diagramed in FIG. 4. The step 110 of providing a housing and the step 120 of mounting LEDs 12 to circuit board 20 in an array are followed by mounting the circuit board in the housing shown as step 130. As mentioned earlier, such mounting in one preferred embodiment is accomplished by snapping fitting 24 into the bottom 10a of the housing with circuit board 20 resting circumferentially on the stepped shelf in the housing. The next step 140 is to pour liquid resin with the metallic particles suspended therein into the housing to embed the circuit board 20 in the resin. In one preferred embodiment, several openings 36 (see FIG. 3) are provided completely through circuit board 20 to allow liquid resin to flow through such openings and substantially completely fill the space between copper layer 26 of the circuit board and the bottom 10a of the housing. Moreover, a sufficient amount of resin is, in a preferred embodiment, provided to permit a layer of resin to be disposed on the front surface 20a of the circuit board 20 and interstitially between the LEDs. In an alternative embodiment, in some situations it may be acceptable and/or desirable not to provide such resin on the front surface 20a of the circuit board, but rather only along the back surface of the circuit board defined by copper layer 26. Also, while not preferred, the resin on the front surface may be separately formed without the heat conductive particles whereas the matrix on the back surface would have such particles embedded therein.

The next step 150, is to cure the resin and thereafter the step 160 of mounting the lens cover 16 to the housing 10 is performed, preferably by snapping the lens cover to the housing and providing silicone sealing, as mentioned.

Figure 5:
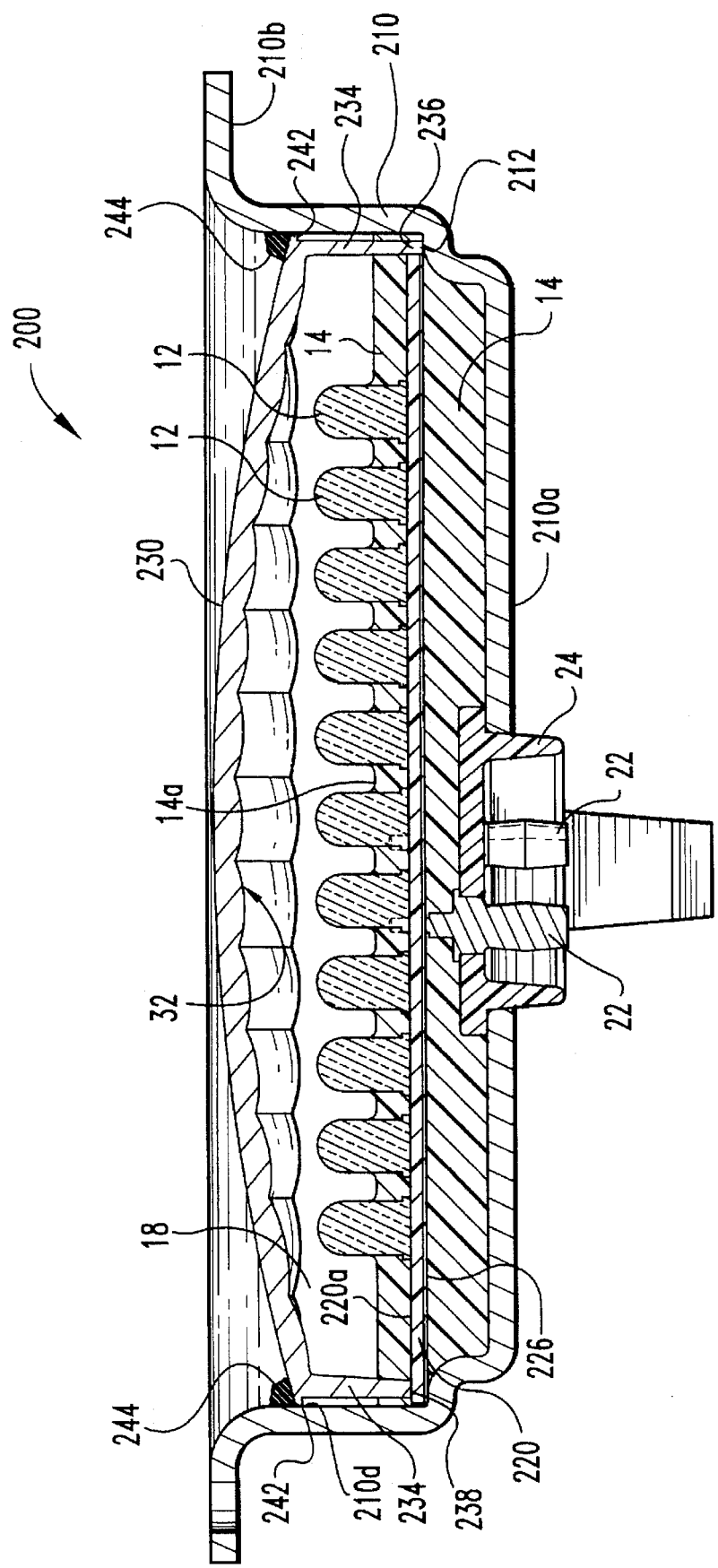
FIG. 5 is a side cross-sectional view similar to FIG. 2, but showing an alternate embodiment of the lamp assembly of the present invention.
Figure 6:
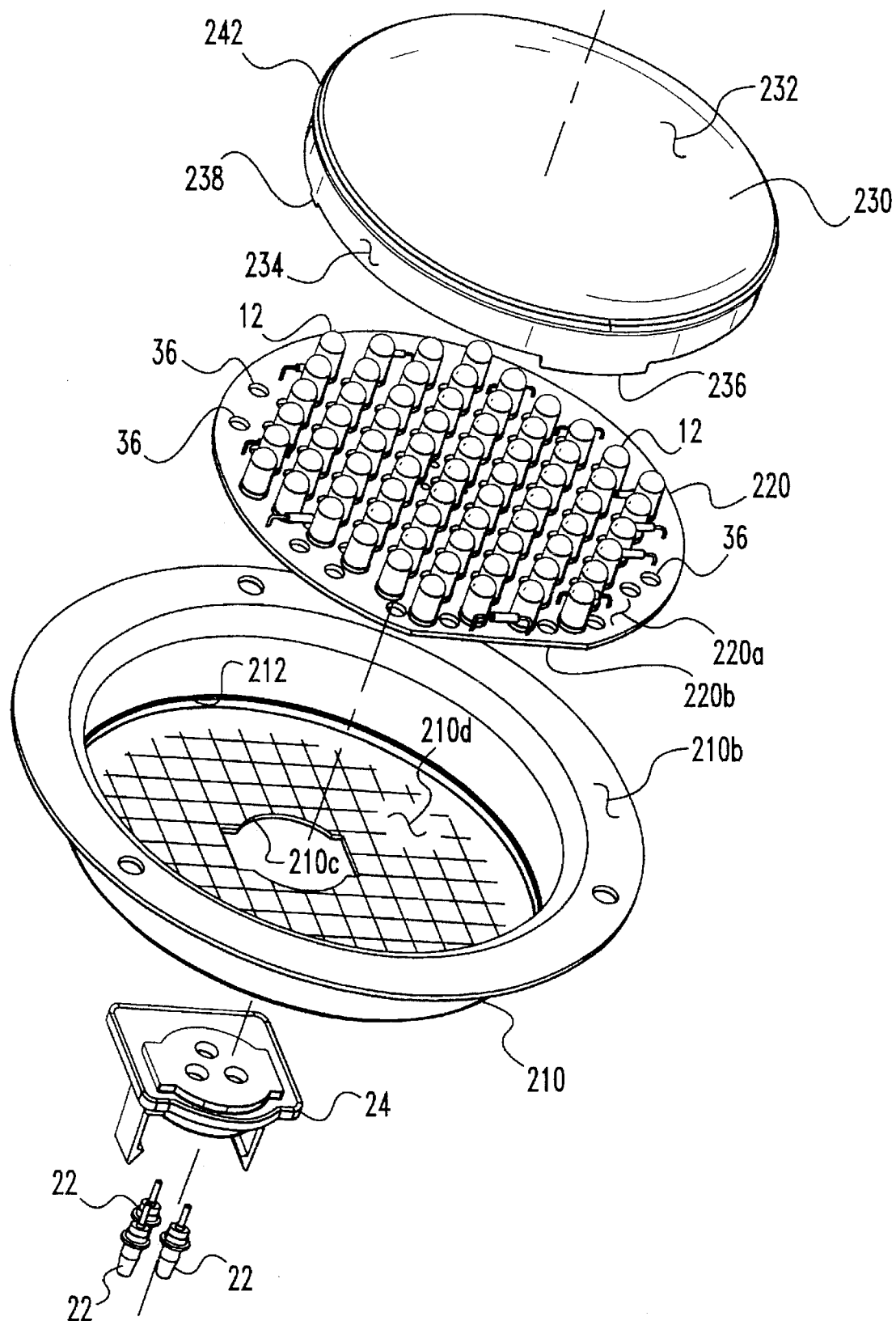
FIG. 6 is an assembly drawing showing the lamp assembly of FIG. 5.
Figure 7:
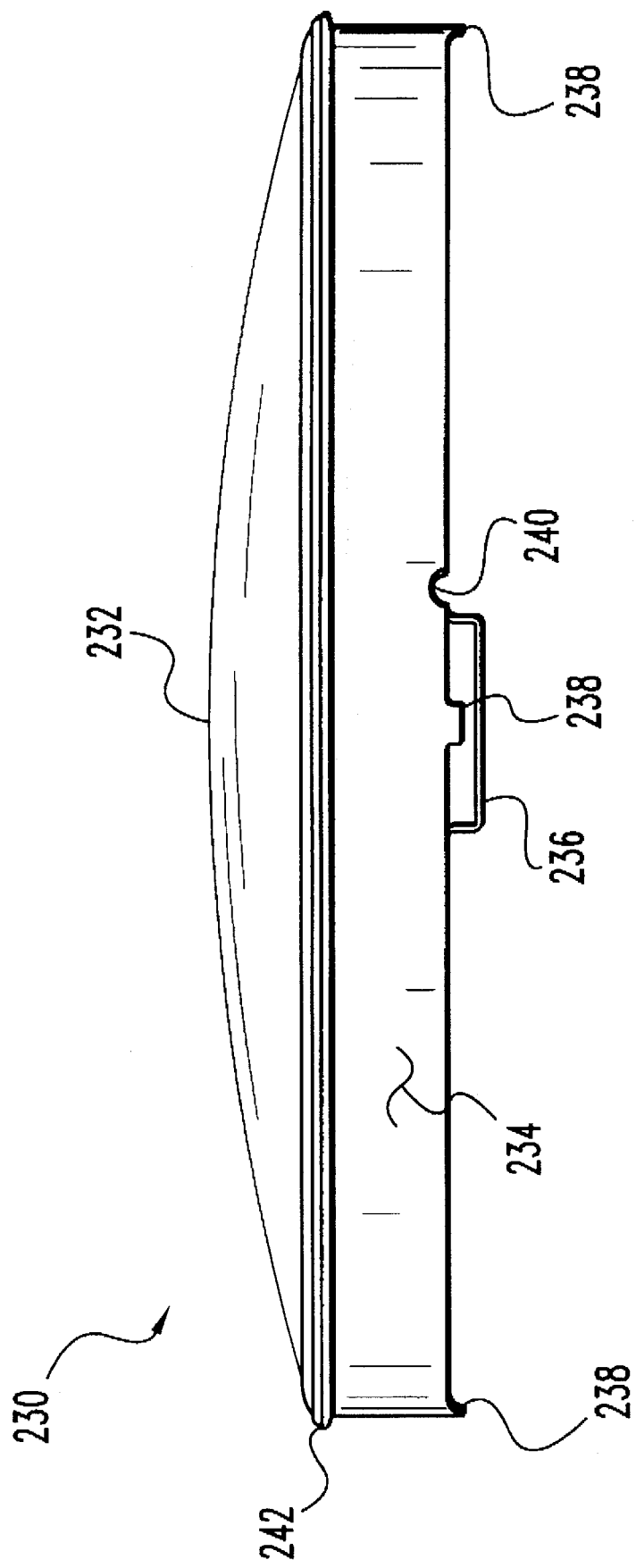
FIG. 7 is a side elevational view of the lens used with the lamp assembly of FIGS. 5 and 6.

Referring now to FIGS. 5–7, an alternate embodiment 200 of the lamp assembly of the present invention is shown. It should be noted that lamp assembly 200 is identical in many respects to lamp assembly 100 of FIGS. 1–3, and like numbers will therefore be used to identify like elements. For the most part, the structural and functional description of such identical elements will not be repeated.

Lamp assembly 200 is modified over the lamp assembly 100 of FIGS. 1–3 mainly to accommodate an alternate embodiment of light transmissive window or lens member 230. In this regard, lamp assembly 200 includes a housing 210 that is identical in most respects to housing 10 with the exception that housing 210 includes only a single annular stepped portion 212. Housing 210 is otherwise similar to housing 10 in that housing 210 includes a bottom portion 210a, an upper flange portion 210b, a bore 210c through bottom portion 210a and an inner housing surface 210d. Preferably, housing 210 is formed of anodized aluminum to promote heat transfer as previously discussed and further to minimize corrosion. Electrical terminals 22 are received within circular recesses of snap-in fitting, or electrical terminal jacket, 24, which is snap fitted into bore 210c of housing 210.

Circuit board 220 is electrically connected to terminals 22 as previously discussed and is supported by annular stepped portion 212 as it is positioned within housing 210. Initially liquid thermally conductive medium 14 is dispensed or otherwise placed within housing 210 and the plurality of holes 36 through circuit board 220 facilitate the locating of medium 14 in the space between the bottom surface 226 of circuit board 220 and the inner surface 210d of the bottom 210a of housing 210.

Lens member 230 includes an outer lens surface 232 that is preferably dome-shaped and an opposite inner lens surface defining lens ribs 32 thereon as previously discussed. A flange 242 extends from an outer periphery of lens member 230 adjacent outer lens surface 232. A lip portion 234 extends generally away from the inner lens surface about the outer periphery of lens member 230. Preferably, lip portion 234 includes a tab 236 extending therefrom which is configured complementarily to a cut out portion 220b of circuit board 220. Further, lip portion 234 includes a number of offsets 238 extending therefrom. Preferably, three such offsets 238 extend from lip portion 234 and are approximately equally spaced apart. Adjacent one of the offsets 238, lip portion 234 defines a channel 240 therethrough, as most clearly shown in FIG. 7.

In the lamp assembly embodiment 200, unlike lamp assembly embodiment 100, lens member 230 is configured to be pressed into contact with surface 220a of circuit board 220 so that at least a lower region of lip portion 234 is embedded within the initially thermally conductive medium. Tab 236 of lip portion 234 is received within the housing 210 adjacent cut out portion 220b of circuit board 220 to thereby provide for proper alignment between lens member 230 and LEDs 12. In this manner, the various rows of LEDs 12 may be easily and reliably aligned with the corresponding rows of ribs 32 during assembly of lamp assembly 200.

Offsets 238 are preferably included as providing regions therebetween that are raised above circuit board surface 220a. As a result, the thermally conductive medium 14 may bond to opposing surfaces of lip portion 234 and circuit board surface 220a to form better attachment therebetween than would be provided in the absence of any such offsets 238.

It has been found that inclusion of the small channel 240 through lip portion 234 facilitates advancement of lens member 230 into housing 210 and lip portion 234 into the thermally conductive medium 14 so as to contact circuit board surface 220a. In the absence of channel 240, air pressure caused by the trapping of air between the inner lens surface and thermally conductive medium 14 causes the lens member 230 to draw away from circuit board 220. Channel 240 acts as an air release gap that relieves the air pressure built up within lens member 230 as lip portion 234 is pushed into the thermally conductive medium 14 and into contact with circuit board surface 220a. The channel 240 subsequently becomes sealed when the thermally conductive medium 14 hardens so that the space 18 between LEDs 12 and lens member 230 is hermetic.

Preferably, a bead of formable medium 244 is disposed about flange 242 in contact with the housing inner surface 210d adjacent flange 242 after lens member 230 is in place as most clearly shown in FIG. 5. Although the hardening of thermally conductive medium 14 hermetically seals lens member 230 to circuit board 220, formable medium 244 provides an additional water-tight seal about the outer lens surface 232. Preferably, formable medium 244 is an adhesive that is curable via ultraviolet light, although the present invention contemplates that any known formable medium 244 may be used that provides a water-tight seal between outer lens surface 232 and inner housing surface 210d, and that may be cured at such a temperature, and under such conditions, that will not harm lens member 230, LEDs 12 and/or circuit board 220.

It should be pointed out that when lamp assembly 200 is assembled, lens member 230 is completely recessed within housing 210. Flange portions 210b of housing 210 thus act to protect lens member 230 from damage due to contact by external forces. Additionally, lens member is preferably formed of ACRYLIC® which has a high resistance to mechanical damage such as scratching, and to degradation due to exposure to ultraviolet light.

Figure 8:
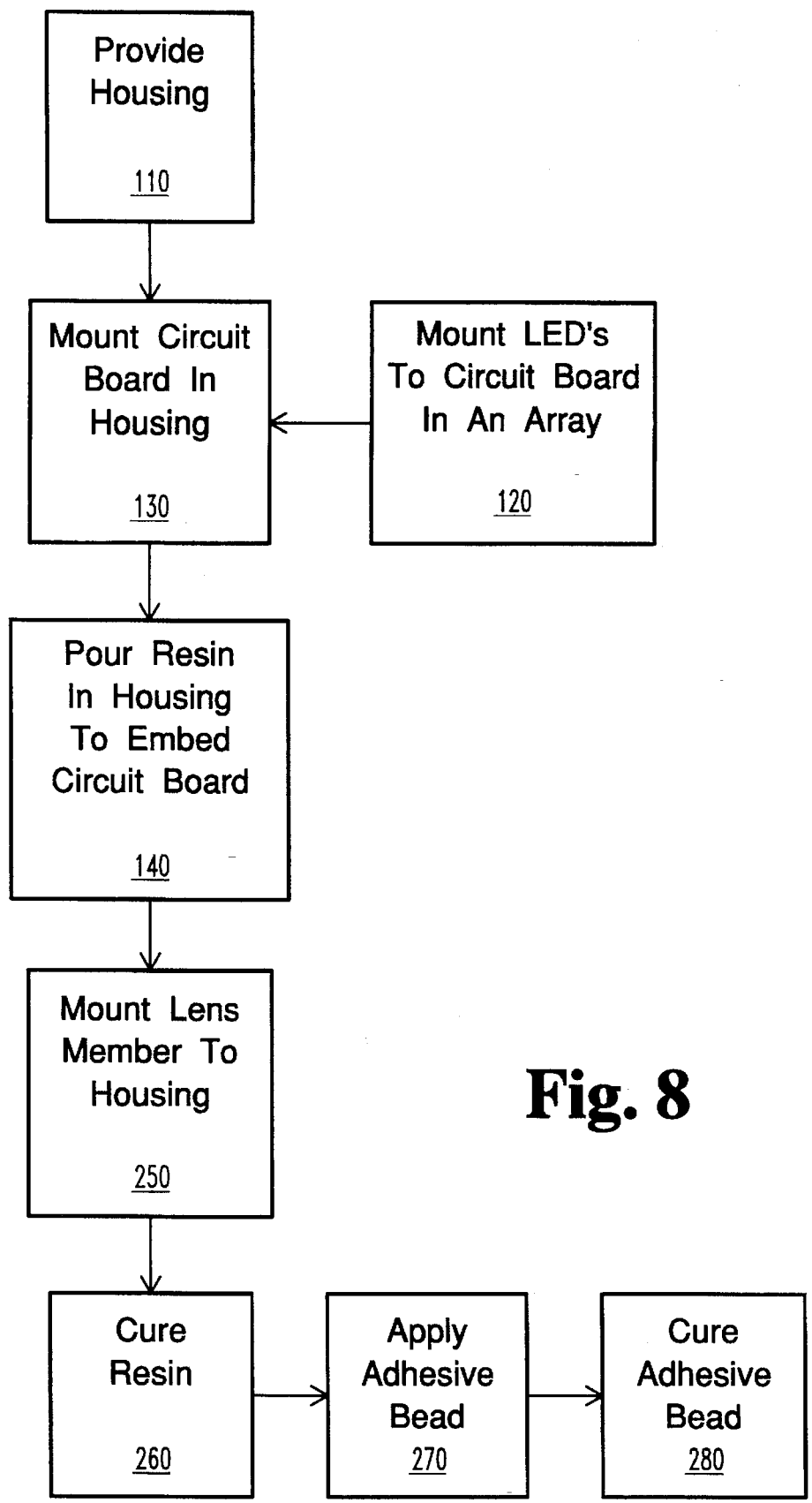
FIG. 8 is a flow chart of one method of manufacturing the lamp assembly of FIGS. 5–7.

Referring now to FIG. 8, a flowchart is shown illustrating one preferred method of manufacturing the lamp assembly 200 of FIGS. 5–7. It should be pointed out that steps 110–140 are identical to steps 110–140 of FIG. 4 which steps have been previously discussed. Picking up from step 140, the method of FIG. 8 advances to step 250 where the lens member 230 is mounted to the housing 210 as described hereinabove. Thereafter at step 260, the resin is cured to provide thermally conductive medium 14. Preferably, thermally conductive medium 14 is comprised of two or more components that exist in a liquid state at room temperature and which cure at a temperature substantially close to room temperature so as not to harm lens member 230, LEDs 12 and/or circuit board 220. The method advances from step 260 to step 270 where an adhesive bead is applied between flange 242 and inner housing surface 210d, and thereafter at step 280, the adhesive bead is cured.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A lamp assembly, comprising:

a housing defining an inner surface;

a light transmissive window on said housing;

at least one light emitting unit mounted to a carrier positioned within said housing, said carrier and said light transmissive window defining a space therebetween, said light emitting unit emitting light toward said light transmissive window; and a formable medium located within said housing, said carrier and said light transmissive window at least partially embedded within said medium, said medium bonding to each of said carrier, said light transmissive window and said inner surface of said housing such that said space is hermetic.

2. The lamp assembly of claim 1 further including a plurality of light emitting units mounted to said carrier and emitting light toward said light transmissive window.

3. The lamp assembly of claim 2 wherein said plurality of light emitting units are light emitting diodes (LEDs).

4. The lamp assembly of claim 3 wherein said LEDs are positioned in at least one row, said row being generally parallel with said light transmissive window, said light transmissive window defining an elongated lens rib extending along and in front of said row of LEDs, said lens rib generally convex toward said row of LEDs and substantially constant in convexity along said lens rib in an elongated direction to allow selective positioning of said LEDs at various locations along said elongated lens rib with substantially constant optics by said elongated lens rib.

5. The lamp assembly of claim 4 further including a plurality of rows of LEDs forming an array, said light transmissive window further defining a corresponding plurality of generally parallel lens ribs extending along and in front of said rows of LEDs.

6. The lamp assembly of claim 5 wherein said light transmissive window further includes means for aligning said window relative to said LEDs such that each of said plurality of lens ribs extend along and in front of a corresponding one of said plurality of rows of LEDs.

7. The lamp assembly of claim 1 wherein said light transmissive window is completely recessed within said housing.

8. The lamp assembly of claim 7 wherein said light transmissive window is generally dome-shaped.

9. The lamp assembly of claim 1 wherein said light transmissive window includes means for releasing air trapped within said space as said window is at least partially embedded within said formable medium.

10. The lamp assembly of claim 1 wherein said light transmissive window includes an inner surface facing said carrier and a lip extending therefrom adjacent an outer periphery of said window, said lip extending into said housing in contact with said carrier and at least partially embedded within said formable medium.

11. The lamp assembly of claim 10 wherein said lip includes a tab extending therefrom;

and wherein said carrier defines a cut out portion configured complementarily to said tab, said tab received within said cut out portion to align said light transmissive window relative to said carrier.

12. A lamp assembly, comprising:

a housing;

a light emitting diode (LED) mounted to a circuit board positioned within said housing;

a first formable medium located within said housing and having said circuit board at least partially embedded therein; and a light transmissive window recessed within said housing and positioned in front of said LED in contact with said first formable medium, said first formable medium bonding to said housing, said circuit board and said light transmissive window.

13. The lamp assembly of claim 12 further including:

a number of electrical terminals electrically connected to said LED and extending from said circuit board; and an electrical terminal jacket positioned within a bore defined in said housing adjacent said circuit board, said electrical terminals extending away from said housing within said electrical terminal jacket.

14. The lamp assembly of claim 12 wherein said light transmissive window further includes means for aligning said window relative to said circuit board.

15. The lamp assembly of claim 12 wherein said light transmissive window is generally dome-shaped.

16. The lamp assembly of claim 12 wherein said light transmissive window includes an inner surface facing said LED and a lip extending therefrom adjacent an outer periphery of said window, said lip extending into said housing in contact with said circuit board and partially embedded within said first formable medium.

17. The lamp assembly of claim 16 wherein said lip includes a tab extending therefrom;

and wherein said circuit board defines a cut out portion configured complementarily to said tab, said tab received within said cut out portion to align said light transmissive window relative to said circuit board.

18. The lamp assembly of claim 16 further including:

a flange extending away from said outer periphery of said light transmissive window; and second formable medium in contact with a portion of said flange and a portion of said housing adjacent said flange, said second formable medium bonding to said portion of said flange and said portion of said housing adjacent said flange.

19. A method of forming a lamp assembly, comprising the steps of:

providing a housing;

positioning a circuit board having a plurality of light emitting diodes (LEDs) mounted thereto in said housing;

filling at least a portion of said housing with an initially fluid material in contact with said circuit board;

positioning a light transmissive window in front of said LEDs and in contact with said initially fluid material; and solidifying said initially fluid material into a solid material bonded to said housing, said circuit board and said light transmissive window.

20. The method of claim 19 further including the step of recessing said light transmissive window within said housing.

21. The method of claim 20 further including the step of applying a bead of adhesive between an outer periphery of said light transmissive window and said housing.

22. The method of claim 21 further including the step of hardening the bead of adhesive to form a seal between said outer periphery of said light transmissive window and said housing.

* * * * *